United States Patent [19]

Talwar

[11] Patent Number: 5,392,009
[45] Date of Patent: Feb. 21, 1995

[54] LOW CURRENT VECTOR MODULATOR

[75] Inventor: Ashok K. Talwar, Westlake Village, Calif.

[73] Assignee: American Nucleonics Corporation, Westlake Village, Calif.

[21] Appl. No.: 171,658

[22] Filed: Dec. 22, 1993

[51] Int. Cl.6 .............................................. H01P 1/22
[52] U.S. Cl. ................................. 333/81 R; 333/109; 333/164; 333/81 A
[58] Field of Search ................ 333/109, 116, 156, 164, 333/81 R, 81 A

[56] References Cited

U.S. PATENT DOCUMENTS 4,016,516  4/1977  Sauter et al. ...................... 333/81 R

FOREIGN PATENT DOCUMENTS 54402  3/1982  Japan ............................... 333/81 A Primary Examiner—Paul Gensler
Attorney, Agent, or Firm—Hoffmann & Baron

[57] ABSTRACT

A low current vector modulator for continuously varying the amplitude and polarity of an RF signal includes first and second hybrid couplers electrically connected at their input ports to an RF source. The characteristic impedance of the hybrid couplers is twice the impedance of the RF source. First and second PIN diodes are electrically coupled to 0° and 90° phase ports of the first hybrid coupler, respectively, and third and fourth PIN diodes are electrically coupled to 0° and 90° phase ports of the second hybrid coupler, respectively. The first and second PIN diodes and the third and fourth PIN diodes also are electrically connected respectively to first and second biasing sources. Varying the biasing provided by the first and second biasing sources varies the amplitude and phase of first and second output signals generated by the first and second hybrid couplers. A third hybrid coupler is electrically coupled at its first and second input ports to the output ports of the first and second hybrid couplers, respectively. The third hybrid coupler is responsive to the first and second output signals and generates an output signal which varies in amplitude and phase in response to the resistance of the first, second, third and fourth PIN diodes.

9 Claims, 3 Drawing Sheets

LOW CURRENT VECTOR MODULATOR

BACKGROUND OF THE INVENTION

1. Field of the Invention

The invention relates to a vector modulator, and more particularly relates to a low current vector modulator for continuously varying the amplitude and polarity (i.e., phase) of a radio frequency (RF) signal.

1. Description of the Prior Art

Conventional vector modulators employing PIN diodes are well known in the art of RF signal control. One example of a vector modulator of the prior art is disclosed in commonly owned U.S. Pat. No. 4,016,516 to Sauter et al., the disclosure of which is incorporated herein by reference. U.S. Pat. No. 4,016,516 discloses a solid state signal controller (i.e., vector modulator) designed for insertion in a radio frequency transmission line or path between a source and a signal utilization device to allow control by external means of signal amplitude and polarity, with a minimum of distortion to the signal. PIN diodes or like devices are used within the signal controller.

FIG. 1 shows a conventional vector modulator 10 employing PIN diodes. The vector modulator includes a power splitter 12 having a resistive network 14 for receiving an RF input signal at an input port 16, and three quadrature hybrids 24, 28, 80. Power splitter 12 splits the received RF signal and generates therefrom first and second output signals which are respectively output via ports 18 and 20. An input port 22 of a first hybrid coupler 24 and an input port 26 of a second hybrid coupler 28 receive the first and second output signals, respectively. First hybrid coupler 24 is also provided with an output port 30, a 0° phase port 32 and a 90° phase port 34. Second hybrid coupler 28 is also provided with an output port 36, a 0° phase port 38 and a 90° phase port 40.

A PIN diode 50 is connected at its anode end through a coupling capacitor 52 to 0° phase port 32 of first hybrid coupler 24. A cathode end of PIN diode 50 is connected to ground. A PIN diode 54 is connected at its anode end through a coupling capacitor 56 to 90° phase port 34 of first hybrid coupler 24. A cathode end of PIN diode 54 is connected to ground. Likewise, a third and a fourth PIN diode 60, 62, are connected at each anode end, respectively, through coupling capacitors 64, 66 to 0° phase port 38 and 90° phase port 40 of second hybrid coupler 28, respectively. Cathode ends of PIN diodes 60, 62 are electrically connected to ground.

Common bias is applied to the anode ends of PIN diodes 50, 54 through biasing means 70. Likewise, common bias is applied to the anode ends of PIN diodes 60, 62 through biasing means 72. Biasing means 70 and 72 may be a circuit which provides a selectable voltage to the PIN diodes.

PIN diodes are electrical devices which display a change in resistance with a change in bias current through the PIN diodes. PIN diodes 50, 54, 60 and 62 each display similar electrical characteristics. Biasing means 70 varies the current through diodes 50 and 54 thereby controlling their respective diode resistances. Biasing means 72 varies the current through diodes 60 and 62 thereby controlling their respective diode resistances.

Typical resistance versus current characteristics of a PIN diode, e.g., a UM9301 manufactured by Unitrode Corporation of Massachusetts, are given in FIG. 2. The resistance of the UM9301 PIN diode is inversely proportional to the biasing current through it, as shown in FIG. 2.

Each of first and second hybrid couplers 24 and 28, combined with PIN diode pairs 50, 54 and 60, 62, respectively, act as biphase variable attenuators. Each biphase variable attenuator is able to provide two transmission phase states, one with 0° of reference phase and the other with 180° of reference phase. In each phase state, attenuation may be varied by varying the current through the PIN diode via biasing means 70 and 72 coupled thereto.

The 0° phase state occurs at the output port of the couplers when the resistance of the associated PIN diodes is greater than the characteristic impedance of the system, i.e., the characteristic impedance of the hybrid coupler. The characteristic impedance is typically 50 ohms. The 180° phase state occurs when the PIN diode resistance is less than the characteristic impedance of the hybrid coupler, i.e., less than 50 ohms.

An output signal is electrically coupled from output port 30 of first hybrid coupler 24 to an input port 82 of a third hybrid coupler 80. Output port 36 of second hybrid coupler 28 is electrically connected to an input port 84 of third hybrid coupler 80. A 0° phase (output) port 86 of third hybrid coupler 80 is shown electrically connected to a 50 ohm load 92. A 90° phase (output) port 86 of third hybrid coupler 80 is shown connected to a 50 ohm termination 90. The characteristic impedance of third hybrid coupler 80 is equal to the characteristic impedance of each of first and second hybrid couplers 24 and 28.

Operation of the biphase attenuator function of the conventional vector modulator 10 is as follows.

An RF signal received at input port 16 is split within power splitter 12 thereby generating first and second RF output signals that are respectively output via ports 18, 20. Because both first and second hybrid couplers 24 and 28 and their associated PIN diodes are identical, only a detailed operation of second hybrid coupler 28 with PIN diodes 60, 62 will be described.

The second RF output signal is provided to input port 26 of second hybrid coupler 28. The second RF output signal is split within second hybrid coupler 28 into two portions. A first portion of the second RF output signal is directed to 0° phase port 38 (terminated by PIN diode 60) and a second portion is directed to 90° phase port 40 (terminated by PIN diode 62). The second portion is delayed 90° in phase relative to the first portion. Part of each portion directed to each phase port is reflected back, the phase and amplitude of the reflected portions being dependent on the impedance seen at each phase port, i.e., the resistance of associated PIN diodes 60 and 62.

It is well known in transmission line theory that a high impedance termination produces a reflection coefficient $R_e$ for each signal arriving at each phase port according to the following equation:

$$R_e = (Z_L - Z_0)/(Z_L + Z_0)$$

where $Z_L$ is the termination impedance and $Z_0$ is the characteristic impedance of the coupler. The reflection coefficient is the ratio of reflected to incident signal voltage at the termination. As the termination impedance $Z_L$ approaches $\infty$, $R_e$ approaches one. As the termination impedance $Z_L$ approaches zero, $R_e$ approaches −1, the negative sign indicating the 180° phase state.

When biasing means 72 is adjusted to supply minimum current to PIN diodes 60, 62, the resistance of the PIN diodes is extremely high (see FIG. 2). Because of the high resistive state of PIN diodes 60 and 62, the reflection coefficients at phase ports 38 and 40 of second hybrid coupler 28 approach one. The first and second portions of the second RF output signal are therefore reflected back into hybrid coupler 28 in-phase (i.e., at a 0° phase state).

The first portion is split into two approximately equal signal components when it is reflected from 0° phase port 38. A first component is directed to input port 26 and a second component is directed to output port 36. The second component is delayed 90° relative to the first component.

The second portion of the second RF output signal is also split into two approximately equal components when it is reflected from 90° phase port 40. A first component is directed to input port 26 and a second component is directed to output port 36. The first component is delayed 90° relative to the second component.

Therefore, the first component reflected from 90° phase port 40 arrives at input port 26 delayed twice by 90° relative to the first component arriving there from 0° phase port 38. The superposition of those two components cancel. The second components reflected from 0° phase port 38 and 90° phase port 40 towards output port 36 arrive thereat in phase since each has been delayed once by 90°. These components add constructively. Thus, an RF signal received at input port 26 of second hybrid coupler 28 (when PIN diodes 60 and 62 are biased to a resistance greater than 50 ohms) appears at output port 36 substantially unchanged in amplitude and 90° out of phase with respect to the signal at the input port 26.

Alternatively, if the 0° phase port 38 and the 90° phase port 40 of second hybrid coupler 28 are short circuited to ground, reflection coefficient $R_e$ at each of those ports approaches −1. By providing high current through PIN diodes 60, 62 by biasing means 72, the resistance of the PIN diodes decreases towards zero ohms. The low resistive state at the 0° and 90° phase output ports 38 and 40, respectively, causes first and second portions of the second RF output signal to be reflected back into hybrid coupler 180° out of phase (i.e., at a 180° phase state).

The superposition of the first signal components reflected from 0° and 90° phase ports 38 and 40, respectively, and arriving at input port 26 results in cancellation there. The superposition of second signal components reflected from the 0° and 90° phase ports, respectively, and arriving at output port 36 results in constructive addition there. Thus, the input signal provided to port 26 appears at output port 36 substantially unchanged in amplitude. The phase, however, is shifted 180° relative to the previously described case in which the PIN diodes are biased to a high resistance state. That is, the output signal at output port 36 while PIN diodes 60 and 62 are biased with a high current displays a phase of −90° relative to the phase of the signal input to the hybrid coupler.

When PIN diodes 60 and 62 are biased to resistance values between a minimum and 50 ohms (the characteristic impedance of the second hybrid coupler), the reflection coefficient at both the 0° and 90° phase ports 38 and 40 varies between approximately −1 and 0. Consequently, the magnitude of the signal appearing at output port 36 may be varied from its approximate maximum value to around zero at the 180° phase state.

When PIN diodes 60 and 62 are biased to resistance values between 50 ohms and their maximum, unbiased impedance, the reflection coefficient at both the 0° and 90° phase ports 38 and 40 varies between 0 and 1. Consequently, the magnitude of the signal appearing at output port 36 may be varied between 0 and approximately 100 percent of its maximum value at the 0° phase state.

Thus, the arrangement of a hybrid coupler with biasable PIN diodes in vector modulator 10 provides biphase, variable attenuation to the second RF output signal from second hybrid coupler 28. The phase of the resulting signal at output port 36 is wholly dependent on the resistance of PIN diodes 60 and 62. If the resistance of PIN diodes 60, 62 is greater than the characteristic impedance of hybrid coupler 28, i.e., 50 ohms, the phase of the signal provided at output port 36 is 90°. If the resistance of PIN diodes 60, 62 is less than 50 ohms, the phase of the signal at output port 36 is −90°.

First hybrid coupler 24 (including PIN diodes 50, 54) operates in a manner similar to that of second hybrid coupler 28 and PIN diodes 60 and 62. Therefore, a first component of a first portion of the first RF output signal reflected from 0° phase port 32 arrives at output port 30 in phase with a first component of a second portion of the first RF output signal reflected from 90° phase port 34, adding constructively. A second component of the first portion of the first RF output signal reflected from 0° phase port 32 arrives at input port 22 180° out of phase with a second component of the second portion reflected from 90° phase port 34, whereby the second components cancel. The phase of the signal provided at output port 30 is either 90° or −90°, depending on the resistive state of PIN diodes 50, 54.

Output signals from output port 36 of second hybrid coupler 28 and output port 30 of first hybrid coupler 24 are combined in third hybrid coupler 80. Third hybrid coupler 80 provides the combined signal to load 92. The specific phase angle and amplitude of the output signal from the vector modulator depend on the amount of attenuation provided by the PIN diodes operating in conjunction with each of first and second hybrid couplers 24 and 28.

There are, however, problems associated with the use of conventional vector modulators, especially in situations where low power consumption is a constraint. Since conventional vector modulators employ hybrid couplers with a characteristic impedance of 50 ohms, the PIN diodes must be driven with sufficient current so that their intrinsic impedance matches the 50 ohm characteristic impedance of the couplers and or as close to 0 ohms as possible when minimum loss with 180° phase state is desired. The minimum resistance is limited by the amount of current available. FIG. 2 shows this current as being about 2 mA per diode. Although such a current may not seem excessive in typical situations, there may arise situations where even lower current drain and power consumption by the vector modulator are required.

OBJECTS AND SUMMARY OF THE INVENTION

It is therefore an object of the present invention to provide a low current vector modulator in which the current consumption of PIN diodes or like devices operating therein has been reduced.

It is another object of the present invention to provide a low current vector modulator in which insertion loss incurred within the vector modulator resulting from the use of low impedance hybrid couplers has been reduced.

In accordance with the present invention, a low current vector modulator for selectively modulating the amplitude and polarity of a radio frequency (RF) signal is provided. The low current vector modulator includes first and second hybrid couplers, each with an input port, an output port, a 0° phase port and a 90° phase port, and each having approximately the same characteristic impedance, for example, 100 ohms. The input ports of the first and second hybrid couplers are electrically coupled to an RF signal source having a characteristic impedance approximately equal to half the characteristic impedance of the first and second hybrid couplers, or for example, 50 ohms.

A first PIN diode is electrically coupled at an anode end to the 0° phase port of the first hybrid coupler and at a cathode end to ground. A second PIN diode is electrically coupled at an anode end to the 90° phase port of the first hybrid coupler and at a cathode end to ground. A third and fourth PIN diode are each electrically coupled at their anode ends to the 0° phase port and 90° phase port, respectively, of the second hybrid coupler. The cathode ends of the third and fourth PIN diodes are connected to ground.

A third hybrid coupler is electrically coupled at an input port to the output port of the first hybrid coupler and at another input port to the output port of the second hybrid coupler. A 0° phase (output) port and a 90° phase (output) port of third hybrid coupler are electrically connected to a load and a termination, respectively. Preferably, a characteristic impedance of the third hybrid coupler is approximately equal to the impedance of the RF signal source.

A first biasing means is electrically connected to the anode end of the first and second PIN diodes and a second biasing means is electrically connected to the anode end of the third and fourth PIN diodes. A predetermined voltage supplied by the first biasing means to the first and second PIN diodes causes a selected current to flow through the diodes, which in turn controls the intrinsic resistance of the first and second PIN diodes thereby varying the reflection coefficients at the 0° and 90° phase ports of the first hybrid coupler. Similarly, a predetermined voltage supplied by the second biasing means to the third and fourth PIN diodes causes a selected current to flow through the diodes, which controls the resistance of the third and fourth PIN diodes thereby varying the reflection coefficients at the 0° and 90° phase ports of the second hybrid coupler.

Varying the reflection coefficients at the phase ports of the first and second hybrid couplers varies the phase angle and amplitude of reflected signals generated on the coupler output ports relative to the phase of the RF signal input. The phase and amplitude of a composite signal generated within the third hybrid coupler from the reflected signals provided by the first and second hybrid couplers and delivered through the third hybrid coupler to the load are thereby controlled.

Since the resistance of the PIN diodes is now matched to the higher characteristic impedance of the hybrid couplers, now preferably 100 ohms, the PIN diodes draw less current than in conventional vector modulators, and yet the arrangement described above is still operable with and matched to a 50 ohm RF signal source and load, as in a conventional modulator.

These and other objects, features and advantages of this invention will become apparent from the following detailed description of illustrative embodiments thereof, which is to be read in conjunction with the accompanying drawings.

DETAILED DESCRIPTION OF THE PREFERRED EMBODIMENTS

Figure 3:
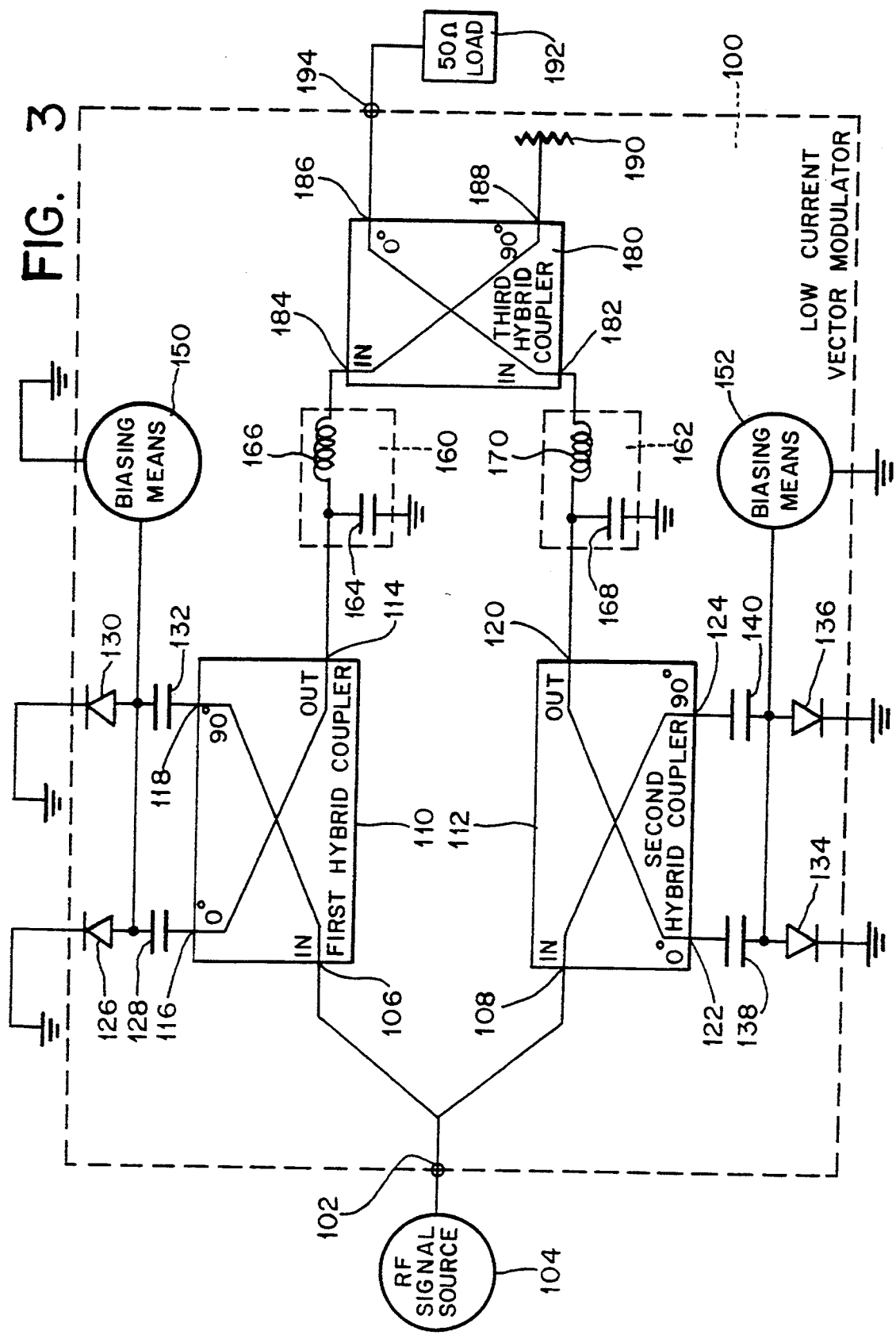
FIG. 3 is a schematic diagram of a vector modulator of the present invention.

A preferred embodiment of a low current vector modulator 100 of the present invention is shown in FIG. 3. Low current vector modulator 100 includes an input port 102 through which the low current vector modulator may be electrically connected to an RF signal source 104. RF signal source 104 has a characteristic impedance of approximately 50 ohms, as is conventional.

Figure 1:
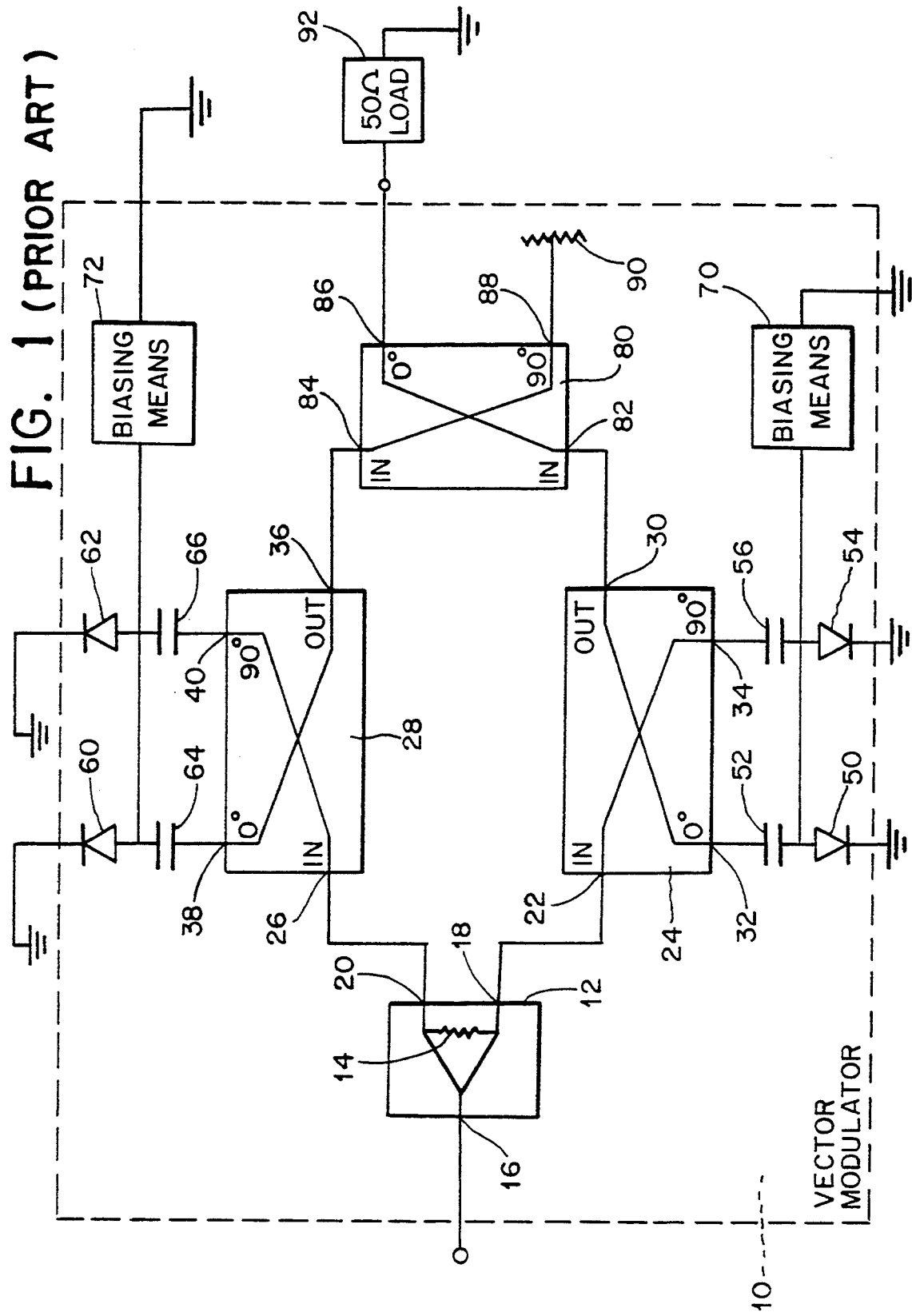
FIG. 1 is a schematic diagram of a vector modulator of the prior art.

Approximately equal portions of an RF signal provided at port 102 by RF signal source 104 are directed to input ports 106 and 108 of first and second hybrid couplers 110 and 112, respectively, by preferably having the input ports 106, 108 coupled in parallel directly to input port 102 of the modulator. In other words, the vector modulator of the present invention eliminates the need of having a power splitter 12 (see FIG. 1) employed in conventional vector modulators. Each hybrid coupler 110, 112 has a characteristic impedance of preferably 100 ohms. Therefore, their direct connection to the 50 ohm RF signal source 104, or alternatively their connection to the source through transmission lines of 100 ohm characteristic impedance, will impedance match with the RF source, as the source sees two 100 ohm impedances connected in shunt. Insertion loss due to power consumption within a power splitter required by a conventional vector modulator (FIG. 1) is therefore eliminated at the input.

First hybrid coupler 110 also includes an output port 114, a 0° phase port 116 and a 90° phase port 118. Similarly, second hybrid coupler 112 includes an output port 120, a 0° phase port 122 and a 90° phase port 124.

A PIN diode 126 is electrically connected at an anode end to 0° phase output port 116 of first hybrid coupler 110 through a coupling capacitor 128. A cathode end of PIN diode 126 is connected to ground. An anode end of another PIN diode 130 is electrically connected to 90° phase output port 118 of first hybrid coupler 110 through a coupling capacitor 132. A cathode end of PIN diode 130 is electrically connected to ground.

Likewise, a third and a fourth PIN diode 134 and 136 are electrically connected at each anode end, respectively, to 0° phase output port 122 and 90° phase output port 124 of second hybrid coupler 112 through coupling capacitors 138 and 140, respectively. Cathode ends of PIN diodes 134 and 136 are electrically connected to ground.

Figure 2:
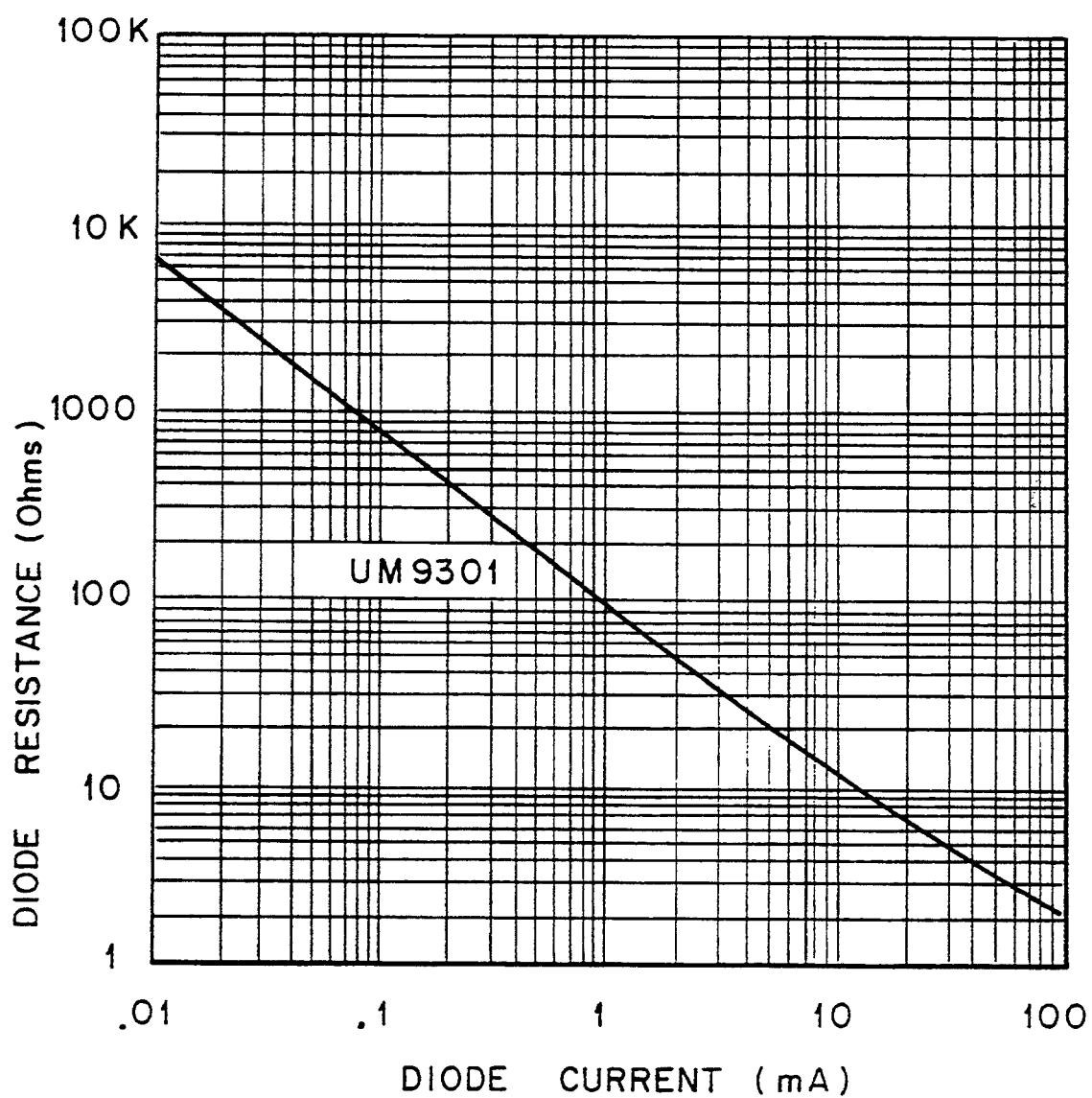
FIG. 2 is a plot of diode resistance versus diode current for a PIN diode of the present invention.

PIN diodes 126, 130, 134, 136 may be any suitable PIN diode such as those described above with reference to FIG. 1, i.e., UM9301 manufactured by Unitrode Corporation located in Massachusetts. The resistance of the UM9301 diode is inversely proportional to the current flowing through it, as shown in FIG. 2. The present invention, however, is not limited to PIN diodes as means to vary the impedance terminating the phase output ports of the first and second hybrid couplers in accordance with bias supplied to them. Any means known to those skilled in the art may be used in place of PIN diodes 126, 130, 134, 136 whose resistance varies with current or voltage.

It should be further noted that the PIN diodes 126, 130, 134, 136 may be reversed in polarity, with their anodes coupled to ground and their cathodes coupled to the hybrid couplers 110, 112 through their respective coupling capacitors 128, 132, 138, 140, as long as proper bias is applied to the PIN diodes as would be known to one skilled in the art.

As shown in FIG. 3, common bias is applied through biasing means 150 to the anode ends of PIN diode pair 126 and 130 to vary the resistance of the PIN diodes. Likewise, common bias is applied through biasing means 152 at the anode ends of PIN diodes 134 and 136 to vary the resistance of those diodes. Biasing means 150 and 152 may be any means known to those skilled in the art, such as a circuit which generates a controllable DC biasing voltage, capable of ensuring that a controllable and selectable current flows through each of the PIN diodes.

First hybrid coupler 110 and PIN diodes 126 and 130, and second hybrid coupler 112 and PIN diodes 134 and 136, act as first and second biphase variable attenuators, respectively. The output signal provided by each biphase variable attenuator exhibits a 0° phase state and a 180° phase state depending upon the resistance of their terminating PIN diodes. The 0° phase state occurs when the PIN diode resistance is equal to or greater than the hybrid coupler's characteristic impedance, which is preferably 100 ohms. The 180° phase state occurs when the PIN diode resistance is less than the hybrid coupler's characteristic impedance.

A third hybrid coupler 180 electrically couples the output signal from first and second hybrid couplers 110 and 112, respectively, to a 50 ohm load 192, which would be the same impedance of the load with a conventional vector modulator. The characteristic impedance of third hybrid coupler 180 is 50 ohms, which is half the impedance of first and second hybrid couplers 110 and 112. Third hybrid coupler 180 includes a first input port 184, a second input port 182, a 0° phase (output) port 186 and a 90° phase (output) port 188. The 0° phase (output) port 186 is electrically connected through the output port 194 of the modulator to 50 ohm load 192, and the 90° phase (output) port 188 is electrically connected to a 50 ohm termination 190. It is envisioned, of course, that the phase (output) ports 186, 188 may be reversed if desired.

The present invention is not limited to the terminal configurations for which the first, second and third hybrid couplers 110, 112 and 180 have been described in the preferred embodiment. The input signals may be provided to different ports on the hybrid couplers and different ports may be terminated with comparable results.

First input port 184 and second input port 182 of third hybrid coupler 180 are preferably electrically coupled through first and second impedance matching networks 160 and 162, respectively, to output ports 114 and 120 of first and second hybrid couplers 110 and 112, respectively. First and second impedance matching networks 160 and 162 are preferred because the characteristic impedance of the third hybrid coupler is preferably 50 ohms, which is half the impedance of the first and second hybrid couplers 110 and 112. Without the impedance matching networks 160, 162, reflections due to impedance mismatch in the vector modulator and losses resulting therefrom may occur.

First impedance matching network 160 includes a capacitor 164 and an inductor 166. The capacitor 164 is electrically connected at a first end to output port 114 of first hybrid coupler 110 and to a first end of inductor 166. A second end of capacitor 164 is electrically connected to ground. A second end of inductor 166 is electrically connected to input port 184 of third hybrid coupler 180. Likewise, second impedance matching network 102 preferably includes capacitor 168 and inductor 170. A first end of capacitor 168 is electrically connected to both output port 120 of second hybrid coupler 112 and a first end of inductor 170. A second end of capacitor 168 is connected to ground. A second end of inductor 170 is electrically connected to the second input port 182 of third hybrid coupler 180. Of course, any other form of 100 to 50 impedance transformation may be employed.

Operation of the low current vector modulator 100 of the present invention is as follows.

An RF signal provided by 50 ohm RF signal source 104 to port 102 of low current vector modulator 100 is passed in approximately equal portions to input ports 106 and 108 of 100 ohm first and second hybrid couplers 110 and 112, respectively. Because first and second hybrid couplers 110 and 112 are electrically connected in parallel to the RF signal source, the hybrid couplers together appear as 50 ohms and are therefore matched to the 50 ohm RF signal source.

The portion of the RF signal provided to first 100 ohm hybrid coupler 110 is split into first and second signal components therein. The first signal component is directed to 0° phase port 116 and the second signal component is directed to 90° phase port 118. The second signal component is delayed 90° in phase relative to the first signal component. Part of each signal component directed to each phase port of first hybrid coupler 110 is reflected back. The phase and amplitude of the reflected signal components depend on the termination impedances at those phase ports, i.e., the resistance of PIN diodes 126 and 130 coupled thereto.

When biasing means 150 is adjusted to drive PIN diodes 126 and 130 with minimum current, the PIN diodes are in a high resistance state (see FIG. 2). The high resistance state renders 90° phase port 118 and 0° phase port 116 approximately open circuited with respect to ground. By terminating those phase ports with a high impedance, a ratio of the amplitudes of the reflected to incident signal energy there approaches one. That is, a reflection coefficient $R_e$ at those phase ports (where $R_e=(z_L-z_O)/(z_L+z_O)$ as defined previously) approaches one. The signal components reflected from 0° phase port 116 and 90° phase port 118, respectively, are in-phase with the incident signal components arriving there.

When reflected from 0° phase port 116, the first signal component is split into two approximately equal portions. A first reflected portion is directed to input port 106 and a second reflected portion is directed to output port 114. The second reflected portion is delayed 90° relative to the first reflected portion.

When reflected from 90° phase port 118, the second signal component is also split into two approximately equal portions. A first reflected portion is directed to input port 106 and a second reflected portion is directed to output port 114. The first reflected portion is delayed 90° relative to the second reflected portion.

The first reflected portion arriving at input port 106 from 90° phase port 118 is thereby delayed twice by 90°, rendering it 180° out of phase with the first reflected portion arriving there from 0° phase port 116. Because the two first reflected portions are 180° out of phase, they cancel.

The second reflected portion arriving at output port 114 from 0° phase port 116 is delayed once by 90°, as is the second reflected portion arriving there from 90° phase port 118. The two reflected second portions add constructively. Thus, a reflected portion of an RF signal received at input port 106 (when PIN diodes 126 and 130 are biased to a resistance equal to or greater than 100 ohms) is passed to output port 114 90° out of phase with respect to the signal provided to the hybrid coupler 110.

Alternatively, if PIN diodes 126 and 130 are driven with maximum current, their resistance is reduced to approaching zero, the reflection coefficient $R_e$ at 0° phase approximately zero. With the resistance of the PIN diodes port 116 and 90° phase port 118 approaches −1. That is, the signals reflected from the 0° and 90° phase ports 116 and 118 display a 180° phase shift relative to the phase of the RF input signal.

It follows that second portions of the RF signal components reflected from phase ports 116 and 118 arrive 180° out of phase at output port 114 relative to signals arriving at output port 114 when the PIN diodes are biased to a high resistance state, i.e., at a −90° phase with respect to the RF input signal.

When biased to a low resistance state, reflection coefficients at PIN diode terminations of the 100 ohm hybrid couplers of the present invention more closely approach −1 in the 180° phase state than do similarly biased PIN diode terminations of 50 ohm hybrid couplers of conventional vector modulators. The closer the reflection coefficient is to −1, the less insertion loss there is to the RF signal seen at the 0° and 90° phase port of the 100 ohm hybrid couplers 110, 112. The improvement in the negative reflection coefficient (i.e., $R_e = (Z_L - Z_O)/(Z_L + Z_O)$, as defined previously) results from the doubling of the range of the load impedance ($Z_L$) which spans between 0 and 100 ohms, the higher value being the characteristic impedance of first and second hybrid couplers 110 and 112, respectively. The range is doubled in comparison to the range of the load impedance of a conventional vector modulator, which range is from 0 to 50 ohms, the higher value being the characteristic impedance of the hybrid couplers used in conventional vector modulators.

For example, biasing PIN diodes of a conventional vector modulator (FIG. 1) to 5 ohms, where the characteristic impedance of the hybrid couplers is 50 ohms, defines, in accordance with the equation described previously, a reflection coefficient $R_e$ of −0.818 at the phase ports. Similar PIN diodes biased to 5 ohms define reflection coefficients $R_e$ of −0.904 at the phase output ports of the 100 ohm hybrid couplers of the present invention. The efficiency of reflection while the PIN diodes are biased to the low impedance state is therefore increased by 10.5% by the present invention. The increased reflection efficiency with the PIN diodes biased to a low impedance state results in a commensurate reduction of insertion loss between the input and output ports of the 100 ohm hybrid couplers.

In signal modulating applications where available biasing power is limited, or where heat considerations require limiting the current supplied to the PIN diodes, the vector modulator of the present invention may be operative at a lower power than a conventional vector modulator and still perform satisfactorily. Because of the relatively higher impedance of the hybrid couplers (i.e., 100 ohms), the present invention can provide a 180° phase state with the PIN diodes biased to a higher resistance, i.e., up to 100 ohms. Vector modulator 100 of the present invention can therefore function efficiently with the PIN diode terminations biased to provide a higher resistance (i.e., driven with a lower current) than would be possible with a vector modulator using 50 ohm hybrid couplers with matching PIN diode terminations without reducing the efficiency of reflection.

The low current vector modulator 100 of the present invention may therefore be utilized to reduce current consumption by a factor of two or more, as is apparent from the PIN diode biasing characteristics shown in FIG. 2. In addition, the present invention, having a higher characteristic impedance, provides the ability to operate with a minimized signal insertion loss due to the higher reflection coefficient $R_e$ when compared to conventional vector modulators having a lower characteristic impedance.

Second hybrid coupler 112 operates essentially the same as the above-described first hybrid coupler 110. The portion of the RF signal provided to second hybrid coupler 112 is split into first and second signal components therein. The first signal component is directed to 0° phase port 122 and the second signal component is directed to 90° phase port 124. The second signal component is delayed 90° in phase relative to the first signal component when incident at port 124.

Part of each of the first and second signal components are reflected from 0° and 90° phase ports 122 and 124, respectively. The phase state of the reflected signal components is dependent on the resistance of PIN diodes 134, 136. With minimum current through PIN diodes 134 and 136 caused by biasing means 152, the PIN diodes are biased in their high resistance state (i.e., 100 ohms or more) so that signals incident at the phase ports are reflected in phase (i.e., the 0° phase state).

Accordingly, a first portion of the first signal component of the RF signal provided to second hybrid coupler 112 is reflected from 0° phase port 122 and arrives at input port 108 in phase with the first signal component. A first portion of the second signal component of the RF signal provided to second hybrid coupler 112 is reflected from 90° phase port 124 and arrives 90° out of the phase at input port 108 relative to the second signal component. There is a total relative phase shift of 180° for the first portion of the second signal. Both first portions add destructively at input port 108, thereby canceling.

A second portion of the first signal component is reflected from 0° phase port 122 and arrives 90° out of phase at output port 120 relative to the first signal component. A second portion of the second signal component is reflected from 90° phase port 124 and arrives at output port 120 in phase with the second portion from port 122. Both second portions add constructively (although 90° out of phase with the hybrid coupler input) at output port 120, with minimal loss.

PIN diodes 134 and 136 may alternatively be driven to their low resistance state (i.e., less than 100 ohms) by passing a maximum current through the PIN diodes. The result of the low impedance state at 0° and 90° phase ports 122 and 124, respectively, is that the signals reflected from those ports are shifted 180° in phase relative to the signals incident there, i.e., relative to the phase of the RF input signal.

Accordingly, first portions of first and second signal components reflected from 0° phase port 122 and 90° phase port 124 arrive 180° out of phase at input port 108. The first portions therefore add destructively, canceling each other. Second portions of first and second signal components reflected from 0° phase port 122 and 90° phase port 124, respectively, add constructively (although −90° out of phase with the RF signal) at output port 120, with minimal loss.

Signals output from port 120 of second hybrid coupler 112 and port 114 of first hybrid coupler 110 are combined in third hybrid coupler 80.

If signals arrive at first input port 184 and second input port 182 of third hybrid coupler 180 in a 90° phase state, the phase of the signal output to load 192 is in the first quadrant. By reversing the phase of one or both of the signals at the output of first and second couplers 110 and 112, respectively, the phase of the output signal provided to load 192 may be obtained in other quadrants.

For example, with both pair of PIN diodes terminating the phase ports of hybrid couplers 110 and 112 biased to low resistance states, output signals are provided to ports 182 and 184 of third hybrid coupler 180 in a −90° phase state. The phase angle of a composite signal generated within third hybrid coupler 180 from the two output signals and provided to load 192 also exists at a −90° phase state relative to the input signal to vector modulator 100. By varying the PIN diode resistances, the phase and magnitude of the signal provided to the load 192 is varied.

As can be seen from the above description, the present invention is capable of providing a vector modulator that uses less current, and that incurs less insertion loss than a conventional vector modulator. It should be noted, however, that the present invention is not limited to first and second hybrid couplers with characteristic impedances of 100 ohms. In other versions of the invention, hybrid couplers may be used having characteristic impedances greater than 100 ohms and still obtain a similar advantage as described herein. Impedance transformers, such as impedance matching networks 160 and 162, may be employed where necessary.

Although illustrative embodiments of the present invention have been described herein with reference to the accompanying drawings, it is to be understood that the invention is not limited to those precise embodiments, and that various other changes and modifications may be effected therein by one skilled in the art without departing for the scope or spirit of the invention.

What is claimed is:

1. A low current vector modulator for modulating the amplitude and polarity of a radio frequency (RF) signal, comprising:

first and second hybrid couplers, each having an input port, an output port, a 0° phase port and a 90° phase port, and each having approximately equal characteristic impedances, where the input ports of the first and second hybrid couplers are each electrically coupled to an RF signal source generating an RF signal to be modulated, the impedance of the RF signal source being approximately equal to half the impedance of the first and second hybrid couplers;

first, second, third and fourth variable resistance terminations, the first, second, third and fourth variable resistance terminations being electrically coupled to the 0° phase port of the first hybrid coupler, the 90° phase port of the first hybrid coupler, the 0° phase port of the second hybrid coupler and the 90° phase port of the second hybrid coupler, respectively;

wherein the first and second hybrid couplers generate first and second output signals on respective output ports, which output signals vary in amplitude and phase with respect to the RF signal in response to changes in resistance of the variable resistance terminations;

a third hybrid coupler, the third hybrid coupler having a first input port, a second input port, a 0° phase output port and a 90° phase output port, the third hybrid coupler being responsive to the first and second output signals and generating a third output signal which varies in phase and amplitude in response to changes in resistance of the first, second, third and fourth variable resistance terminations; and resistance varying means electrically coupled to the first, second, third and fourth variable resistance terminations for varying the resistance of the terminations.

2. A low current vector modulator as defined by claim 1, wherein the characteristic impedance of the third hybrid coupler is approximately equal to the characteristic impedance of the RF signal source.

3. A low current vector modulator as defined by claim 1, wherein the characteristic impedance of the first and second hybrid couplers are each 100 ohms, and wherein the characteristic impedance of the third hybrid coupler and the RF signal source is 50 ohms.

4. A low current vector modulator as defined by claim 1, wherein the first, second, third and fourth variable resistance terminations respectively include a first, second, third and fourth PIN diode, and wherein each of the first, second, third and fourth PIN diode has an anode and a cathode.

5. A low current vector modulator as defined by claim 4, wherein the anodes of the first and third PIN diodes are electrically coupled to the 0° phase ports of the first and second hybrid couplers, respectively, the anodes of the second and fourth PIN diodes are electrically coupled to the 90° phase ports of the first and second hybrid couplers, respectively, and the cathodes of each of the first, second, third and fourth PIN diodes are electrically coupled to ground.

6. A low current vector modulator as defined by claim 5, wherein the resistance varying means includes first and second biasing means, the first biasing means being electrically coupled to the first and second PIN diodes and the second biasing means being electrically coupled to the anodes of the third and fourth PIN diodes.

7. A low current vector modulator as defined by claim 1, further comprising first and second impedance matching networks, the first impedance matching network being electrically connected between the output port of the first hybrid coupler and the first input port of the third hybrid coupler, and the second impedance matching network being electrically connected between the output port of the second hybrid coupler and the second input port of the third hybrid coupler.

8. A low current vector modulator as defined by claim 7, wherein each of the first and second impedance matching networks includes at least one inductor and at least one capacitor coupled to the at least one inductor.

9. A low current vector modulator as defined by claim 1, further comprising a first capacitor electrically connected between the first variable resistance termination and the 0° phase port of the first hybrid coupler, a second capacitor electrically connected between the second variable resistance termination and the 90° phase port of the first hybrid coupler, a third capacitor electrically connected between the third variable resistance termination and the 0° phase port of the second hybrid coupler and a fourth capacitor electrically connected between the fourth variable resistance termination and the 90° phase port of the second hybrid coupler.

* * * * *